(12) United States Patent
Lachmund et al.

(10) Patent No.: US 9,500,680 B2
(45) Date of Patent: Nov. 22, 2016

(54) METHOD FOR DETERMINING THE ABSENCE OF VOLTAGE IN AN ELECTRICAL HIGH-VOLTAGE SYSTEM, AND ELECTRICAL HIGH-VOLTAGE SYSTEM

(71) Applicant: VOLKSWAGEN AG, Wolfsburg (DE)

(72) Inventors: Uwe Lachmund, Berlin (DE); Ronny Hänsch, Gifhorn (DE)

(73) Assignee: VOLKSWAGEN AG, Wolfsburg (DE)

( * ) Notice: Subject to any disclaimer, the term of this patent is extended or adjusted under 35 U.S.C. 154(b) by 83 days.

(21) Appl. No.: 14/367,343

(22) PCT Filed: Dec. 14, 2012

(86) PCT No.: PCT/EP2012/075539
§ 371 (c)(1),
(2) Date: Jun. 20, 2014

(87) PCT Pub. No.: WO2013/092410
PCT Pub. Date: Jun. 27, 2013

(65) Prior Publication Data
US 2015/0192623 A1 Jul. 9, 2015

(30) Foreign Application Priority Data

Dec. 24, 2011 (DE) ........................ 10 2011 122 420

(51) Int. Cl.
*G01R 19/165* (2006.01)
*B60L 3/00* (2006.01)
(Continued)

(52) U.S. Cl.
CPC ........... *G01R 19/165* (2013.01); *B60L 3/0046* (2013.01); *B60L 3/0069* (2013.01);
(Continued)

(58) Field of Classification Search
None
See application file for complete search history.

(56) References Cited

U.S. PATENT DOCUMENTS

| 4,375,672 A | 3/1983 | Kato et al. |
| 5,594,411 A | 1/1997 | Ono |
| (Continued) | | |

FOREIGN PATENT DOCUMENTS

| CN | 101587345 A | 11/2009 |
| DE | 102005052782 A1 | 5/2007 |
| (Continued) | | |

OTHER PUBLICATIONS

Search Report for German Patent Application No. 10 2011 122 420.7; Sep. 25, 2012.

(Continued)

*Primary Examiner* — Jermele M Hollington
*Assistant Examiner* — Douglas X Rodriguez
(74) *Attorney, Agent, or Firm* — Barnes & Thornburg LLP

(57) ABSTRACT

A method for determining the absence of voltage in an electrical high-voltage system, in particular in an electric or hybrid vehicle, by using at least two control units in the high-voltage system and at least one display unit, wherein the control units detect the voltage in the high-voltage system independently of one another, wherein an absence of voltage is displayed on the display unit only if both control units detect a voltage below a threshold value. Also disclosed is an electrical high-voltage system.

15 Claims, 1 Drawing Sheet

(51) Int. Cl.
*G01R 19/155* (2006.01)
*G01R 19/00* (2006.01)
*G01R 31/00* (2006.01)

(52) U.S. Cl.
CPC ......... *G01R 19/0084* (2013.01); *G01R 19/155* (2013.01); *G01R 31/006* (2013.01)

(56) References Cited

U.S. PATENT DOCUMENTS

| | | | | |
|---|---|---|---|---|
| 5,739,668 | A | * | 4/1998 | Nishikiori ............. H02J 7/0078 320/111 |
| 2007/0120694 | A1 | * | 5/2007 | Lindsey ........... G01R 19/16538 340/662 |
| 2009/0108803 | A1 | | 4/2009 | Singarajan et al. |
| 2009/0228163 | A1 | * | 9/2009 | Tarchinski ............ B60L 3/0046 701/22 |
| 2011/0029144 | A1 | | 2/2011 | Muller et al. |
| 2013/0063273 | A1 | * | 3/2013 | Bhageria ................ G08B 21/00 340/653 |

FOREIGN PATENT DOCUMENTS

| | | |
|---|---|---|
| DE | 102006050529 A1 | 4/2008 |
| DE | 102009012129 A1 | 9/2010 |
| DE | 102010012154 A1 | 9/2011 |
| DE | 102011122420 A1 | 6/2013 |
| JP | 11266502 | 9/1999 |
| JP | 2001327001 A | 11/2001 |
| KR | 1020010054123 | 7/2001 |
| KR | 1020060097024 | 10/2006 |
| KR | 1020080030753 | 4/2008 |
| WO | 2013092410 A1 | 6/2013 |

OTHER PUBLICATIONS

Search Report for International Patent Application No. PCT/EP2012/075539; Apr. 15, 2013.
Office Action for Korean Patent Application No. 10-2014-7017844; Nov. 24, 2015.

* cited by examiner

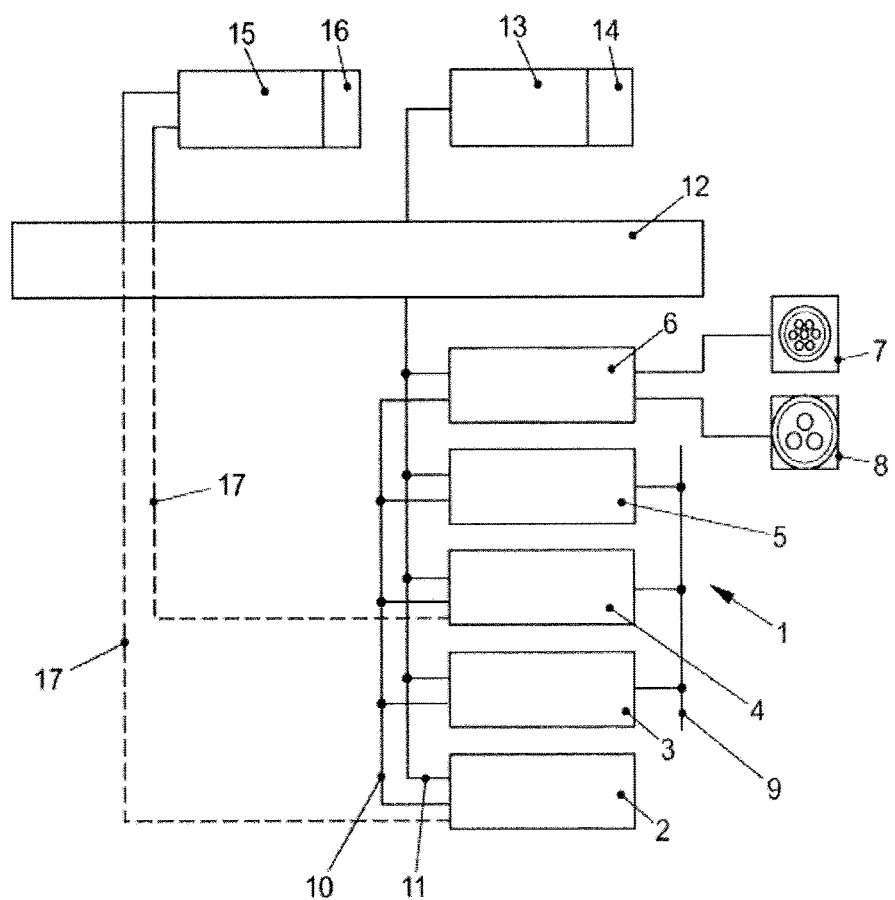

METHOD FOR DETERMINING THE ABSENCE OF VOLTAGE IN AN ELECTRICAL HIGH-VOLTAGE SYSTEM, AND ELECTRICAL HIGH-VOLTAGE SYSTEM

PRIORITY CLAIM

This patent application is a U.S. National Phase of International Patent Application No. PCT/EP2012/075539, filed 14 Dec. 2012, which claims priority to German Patent Application No. 10 2011 122 420.7, filed 24 Dec. 2011, the disclosures of which are incorporated herein by reference in their entirety.

SUMMARY

Illustrative embodiments relate to a method for checking safe isolation from the supply in a high-voltage electrical system and to such a high-voltage electrical system.

BRIEF DESCRIPTION OF THE DRAWINGS

The invention will be explained in more detail below with reference to an exemplary embodiment.

FIG. 1 shows a schematic block circuit diagram for automatically checking safe isolation from the supply in a high-voltage electrical system in an electric or hybrid vehicle.

DETAILED DESCRIPTION OF THE DISCLOSED EMBODIMENTS

Disclosed embodiments provide a method for checking safe isolation from the supply in a high-voltage electrical system and such a high-voltage electrical system, by means of which safe isolation from the supply can be determined more reliably.

The method and/or the high-voltage electrical system, in particular of an electric or hybrid vehicle, comprises at least two control devices and at least one display unit, wherein the control devices detect, independently of one another, the voltage in the high-voltage system, wherein safe isolation from the supply is only displayed on the display unit when both control devices or the control devices involved detect a voltage below a threshold value. Thus, the voltage in the high-voltage system is detected in a redundant manner, with the result that individual faults can be identified safely. In this case, the control devices can detect the same voltage or different voltages in the high-voltage system, i.e., can measure the voltage at different potential points.

Since 60 V is the critical variable for protection against electric shock, the threshold value can be 20 V or 25 V, for example. The representation of the state of safe isolation from the supply on the display unit may be performed as a pictogram, with the result that the respectively represented pictogram represents a logic combination of the individual detected voltage values. However, it is also possible for the detected actual values for the voltage to be represented individually, wherein the actual values are represented in different colors depending on the value, for example. A combination of display forms is also possible. It should further be noted that, in the event of faulty measurement of a control device, this may be evaluated logically as exceeding the threshold value since there is possibly no safe isolation from the supply. In this case, in supplementary fashion to the representation on the display unit in respect of the state of safe isolation from the supply (in this case no safe isolation from the supply), it is possible to show that a fault has occurred in a control device.

In at least one disclosed embodiment, at least the actual values for the detected voltage are represented on at least one further display unit. By using two display units, the method is also tolerant to individual faults of a display unit since in each case both display units need to display safe isolation from the supply.

In a further disclosed embodiment, an external diagnosis device is connected, wherein the external diagnosis device is connected to the control devices in the high-voltage system via a gateway control device and/or is connected directly to individual control devices. In this case, the method for checking safe isolation from the supply can be initiated by the diagnosis device. Alternatively, however, the method can also be initiated via at least one vehicle-internal control device. For example, an input means can be provided in the vehicle, with the actuation of the input means being detected by a control device. Correspondingly, a predetermined pedal actuation or the like can also be the triggering event.

In a further disclosed embodiment, a state of safe isolation from the supply and/or the detected actual values is/are represented on a display unit of the diagnosis device and a state of safe isolation from the supply and/or the detected actual values are represented on a display unit of an electric or hybrid vehicle. There is thus also display with redundancy, with the result that individual faults of a display unit are also identified. Optionally, the display unit in the electric or hybrid vehicle is that of an instrument cluster. In at least one disclosed embodiment, the state of safe isolation from the supply may be represented as a pictogram, for example, in the display unit of the vehicle, optionally the instrument cluster, whereas the actual values are displayed on the display unit of the diagnosis device. The user then needs to take heed of both display units, wherein safe isolation from the supply is only present when the display unit of the vehicle displays the state safe isolation from the supply and the represented actual values on the display unit of the diagnosis device are below the threshold value(s).

In a further disclosed embodiment, at least one message is transmitted to at least one control device by the diagnosis device, by means of which message the checking of safe isolation from the supply is initiated. In a motor vehicle, this may take place when the ignition is switched on, i.e. when terminal 15 is switched on.

In a further disclosed embodiment, the control devices for detecting the voltage are at least one battery management control device and/or a control device of a further high-voltage component of the high-voltage system of the vehicle, in particular the power electronics of an electric machine. In at least one disclosed embodiment, the battery management control device is in this case the central collection point for the data of the other control devices and transmits the data, preprocessed via the gateway control device, for example, to the display unit(s).

In a further disclosed embodiment, in addition, a control device of a charger detects a voltage and/or a control device of a charge manager detects the plug state of at least one electrical socket outlet.

The high-voltage system 1 comprises a motor control device 2, a control device 3 of power electronics, a battery management control device 4, a control device 5 of a charger and a control device 6 of a charge manager, which is connected to an AC charging socket 7 and a DC charging socket 8. The control device 3 of the power electronics, the battery management control device 4 and the control device 5 of the charger are connected to high-voltage lines 9 of the high-voltage system 1. In the exemplary embodiment illustrated, the control devices 2-6 are connected to one another by two bus systems 10, 11, wherein one bus system 11 is connected to a gateway control device 12. The control devices 2-6 are connected to an instrument cluster 13 comprising a display unit 14 and to an external diagnosis device 15 comprising a display unit 16, via the gateway control device 12. Furthermore, the motor control device 2 and the battery management control device 4 are connected directly to the diagnosis device 15 via in each case one line 17.

If the user would now like to check to see whether the high-voltage system 1 is disconnected or safely isolated from the supply, a corresponding message is transmitted to the battery management control device 4 via the line 17 by means of the diagnosis device 15. The control devices 3-5 involved then measure the voltage on the high-voltage line 9 and compare this voltage with a threshold value. The battery management control device 4 receives a state value from the control devices 3 and 5. Alternatively or in addition, the battery management control device 4 can also receive in each case one actual value from the control devices 3 and 5. The actual values are in this case the voltage values which the control devices 3, 5 have measured on the high-voltage lines 9. The state values indicate whether the respectively measured voltage is above or below the threshold value or whether a fault has occurred in the measurement. Furthermore, the control device 6 communicates the plug state of the charging sockets 7, 8, i.e. whether a charging plug is inserted or not. The battery management control device 4 then links the states conjunctively, i.e. when all of the control devices 3-5 have determined a state value safe isolation from the supply and no charging plug is inserted, the overall state of the high-voltage system is that of safe isolation from the supply. This overall state is transmitted from the battery management control device 4 to the instrument cluster 13 via the gateway control device 12 and represented on the display unit 14. Furthermore, the control devices 3, 4 and 5 transmit the detected actual values to the diagnosis device 15 via the gateway control device 12, and the actual values are displayed on the diagnosis device on the display unit 16. Alternatively, the battery management control device 4 transmits the detected actual values of all the control devices 3-5 to the diagnosis device 15 via the gateway control device 12 or directly via the line 17, and the actual values are represented at the diagnosis device on the display unit 16. In addition to the actual values, state values can also additionally be transmitted to the diagnosis device 15.

If both the data on the display unit 14 and on the display unit 16 show that the high-voltage system 1 is safely isolated from the supply, the user can switch off the ignition (terminal 15 off) and operate on the high-voltage system 1. It should be noted here that the threshold values may have hysteresis to avoid rapid changes in the assessment of safe isolation from the supply and no safe isolation from the supply.

If the method now reveals that the high-voltage system 1 is not safely isolated from the supply, the method can be repeated for safety. Alternatively, further measures for disconnecting the high-voltage system 1 can also be implemented, and then the checking method can subsequently be repeated.

Electric drives are used in modern electric or hybrid vehicles, for example. The electric drive for this purpose has a high-voltage power supply which is galvanically isolated from the low-voltage electrical distribution system of the motor vehicle. This power supply comprises a high-capacity electric battery, which generates a high DC voltage, and power electronics comprising an inverter of the electric drive. The drive is equipped with an IT (isolé terre=isolated ground) system, and therefore the risk to service personnel, for example is reduced. Therefore, the insulation should be monitored by measuring the insulation resistance of the power supply to the vehicle ground. However, not only is the monitoring of the insulation important for safety, but also reliable isolation of the battery from the power supply in the idle state, for example for servicing purposes. For this purpose, contactors are used which are open in the idle state to mechanically isolate the battery from the power supply, in particular from the DC link of the inverter, with the result that the lines and the power electronics as well as the electric motor are safely isolated from the supply.

DE 10 2006 050 529 A1 discloses a circuit arrangement for insulation and contactor monitoring of the power supply of an electric drive, comprising a battery for supplying voltage to the electric drive, power electronics fed by the battery for driving an electric motor of the electric drive, at least one contactor for electrically isolating all terminals of the battery from the power electronics, a voltage source connected to a reference potential for generating a measurement voltage for insulation and contactor monitoring, two voltmeters for measuring a voltage step generated by the measuring voltage with reference to the reference potential, wherein the voltage source and a first of the voltmeters are electrically connected to a feed point for feeding the measuring voltage and a second of the voltmeters is electrically connected to a measurement point for measuring the voltage step, and the feed point and the measurement point are arranged in such a way that the at least one contactor is connected therebetween.

The invention claimed is:

1. A method for checking safe isolation of a low-voltage electrical distribution system from a high-voltage power supply in a high-voltage electrical system in an electric or hybrid vehicle, the method comprising:
   using at least two of a plurality of control devices in the high-voltage system to detect, independently of one another, a voltage on high-voltage lines in the high-voltage system and indicate whether the respectively measured voltages are above or below a threshold voltage value or whether a fault has occurred in the measurement;
   determining whether there is safe isolation of the low-voltage electrical distribution system from the high-voltage power supply using the at least two of the plurality of control devices based on the detected voltage on the high-voltage lines in the high-voltage system measured by the at least two of the plurality of control devices; and
   displaying an indication of the determined safe isolation of the low-voltage electrical distribution system from the high-voltage power supply on at least one display unit, wherein the displaying of the indication of the determined safe isolation is performed only in response to and based on the determination of the safe isolation performed based on the at least two of the plurality of control devices all detecting a voltage below the threshold voltage value.

2. The method of claim 1, wherein at least detected actual values for the voltage in the high-voltage electrical system are represented on at least one further display unit.

3. The method of claim 1, wherein an external diagnosis device is connected to the control devices in the high-voltage electrical system via a gateway control device and/or is connected directly to individual control devices.

4. The method of claim 3, wherein a state of safe isolation of the low-voltage electrical distribution system from the high-voltage power supply and/or the detected actual values is/are represented on a display unit of the diagnosis device and a state of safe isolation of the low-voltage electrical distribution system from the high-voltage power supply and/or the detected actual values are represented on a display unit of the electric or hybrid vehicle.

5. The method of claim 3, further comprising checking safe isolation of the low-voltage electrical distribution system from the high-voltage power supply when at least one message is transmitted to at least one control device by the diagnosis device.

6. The method of claim 1, wherein the control devices for detecting the voltage are at least one battery management control device and/or a control device of a high-voltage component of the high-voltage electrical system of the vehicle.

7. The method of claim 6, further comprising:
detecting, with a control device of a charger, a voltage; and
detecting, with a control device of a charge manager, the plug state of at least one electrical socket outlet.

8. A high-voltage electrical system, in an electric or hybrid vehicle, the high voltage electrical system comprising:
an electric drive including a high-voltage power supply and a low-voltage electrical distribution system for the vehicle, wherein the high-voltage power supply is galvanically isolated from the vehicle's low-voltage electrical distribution system and the high-voltage power supply includes a high-capacity electric battery;
at least two of a plurality of control devices that detect, independently of one another, a voltage on high-voltage lines in the high-voltage electrical system and indicate whether the respectively measured voltages are above or below a threshold voltage value or if a fault has occurred in the measurement; and
at least one display unit,
wherein the at least two of the plurality of control devices detect, independently of one another, a voltage in the high-voltage system,
wherein there is a determination of safe isolation of the low-voltage electrical distribution system from the high-voltage power supply based on the detected voltage on the high-voltage lines in the high-voltage system measured by the at least two of the plurality of control devices, and
wherein an indication of the determined safe isolation of the low-voltage electrical distribution system from the high-voltage power supply is displayed on the at least one display unit, wherein the indication of the determined safe isolation is displayed only in response to and based on the determination of the safe isolation performed based on the at least two of the plurality of control devices all detect a voltage below the threshold voltage value.

9. The system of claim 8, wherein at least detected actual values for the voltage in the high-voltage electrical system are represented on at least one further display unit.

10. The system of claim 8, wherein an external diagnosis device is connected to the control devices in the high-voltage electrical system via a gateway control device and/or is connected directly to individual control devices.

11. The system of claim 10, wherein a state of safe isolation of the low-voltage electrical distribution system from the high-voltage power supply and/or the detected actual values is/are represented on a display unit of the diagnosis device and a state of safe isolation of the low-voltage electrical distribution system from the high-voltage power supply and/or the detected actual values are represented on a display unit of the electric or hybrid vehicle.

12. The system of claim 11, wherein at least one message is transmitted to at least one control device by the diagnosis device, whereby the checking of safe isolation of the low-voltage electrical distribution system from the high-voltage power supply is initiated.

13. The system of claim 8, wherein the control devices for detecting the voltage are at least one battery management control device and/or a control device of a high-voltage component of the high-voltage electrical system of the vehicle.

14. The system of claim 13, further comprising a control device of a charger detecting a voltage and/or a control device of a charge manager detecting the plug state of at least one electrical socket outlet.

15. A method for checking safe isolation of a low-voltage electrical distribution system from a high-voltage power supply in a high-voltage electrical system in an electric or hybrid vehicle, the method comprising:
using at least two of a plurality of control devices in the high-voltage system
to detect, independently of one another, a state value indicating a voltage on high-voltage lines is above or below a threshold voltage value in the high-voltage system or whether a fault has occurred in the measurement, wherein one of the plurality of control devices is a control device of a charge manager detecting a plug state of at least one electrical socket outlet;
determining whether there is safe isolation of the low-voltage electrical distribution system from the high-voltage power supply using the at least two of the plurality of control devices based on the detected state values indicating a voltage on the high-voltage lines is below a threshold value; and
displaying an indication of the determined safe isolation of the low-voltage electrical distribution system from the high-voltage power supply on at least one display unit, wherein the displaying of the indication of the determined safe isolation is performed only in response to and based on the determination of the safe isolation performed based on the at least two of the plurality of control devices all detecting a state value indicating a voltage below the threshold voltage value and the control device of the charge manager of the plurality of control devices detects no charging plug inserted in the at least one electrical socket outlet.

* * * * *